United States Patent [19]
Momose

[11] Patent Number: 5,254,943
[45] Date of Patent: Oct. 19, 1993

[54] INTEGRATED CIRCUIT DEVICE WITH A TEST CIRCUIT FOR A MAIN CIRCUIT

[75] Inventor: Yuya Momose, Tokyo, Japan
[73] Assignee: NEC Corporation, Tokyo, Japan
[21] Appl. No.: 911,987
[22] Filed: Jul. 13, 1992
[30] Foreign Application Priority Data
Jul. 12, 1991 [JP] Japan .................. 3-171494
[51] Int. Cl.⁵ ........................... G01R 31/02
[52] U.S. Cl. .................. 324/158 R; 324/73.1; 371/15.1; 371/22.6
[58] Field of Search .......... 324/73.1, 158 R; 371/22.3, 22.6, 15.1, 25.1, 27; 437/8; 364/483; 365/201; 307/303, 303.1

[56] References Cited
U.S. PATENT DOCUMENTS

| | | | |
|---|---|---|---|
| 4,894,605 | 1/1990 | Ringleb et al. | 324/158 R |
| 4,949,033 | 8/1990 | Kono et al. | 324/158 R |
| 4,956,818 | 9/1990 | Hatayama et al. | 371/22.6 |
| 4,961,053 | 10/1990 | Krug | 324/158 R |
| 5,097,207 | 3/1992 | Perner | 324/73.1 |

*Primary Examiner*—Vinh Nguyen
*Attorney, Agent, or Firm*—Foley & Lardner

[57] ABSTRACT

For a test operation on a main circuit without supplying a test signal from a test unit, an integrated circuit device includes, a supplementary or test circuit in addition to the main circuit. A test signal is produced in the test circuit and is supplied to the main circuit. Responsive to the test signal, the main circuit produces a data signal. The test circuit processes the data signal into a result signal representative of a result of the test operation. The result signal is supplied to a peripheral or test unit which is well known in the art. It is preferable that the test circuit carries out the test operation with reference to a combination of a particular signal having a predetermined cycle and a particular phase and a specific signal having the predetermined cycle and a specific phase which is different from the particular phase.

7 Claims, 4 Drawing Sheets

INTEGRATED CIRCUIT DEVICE WITH A TEST CIRCUIT FOR A MAIN CIRCUIT

BACKGROUND OF THE INVENTION

This invention relates to an integrated circuit device comprising a circuit element, such as a random logic, a memory, and others, and a test circuit for the circuit element. Therefore, the circuit element will be called a main circuit.

Recently, remarkable improvements have been made in the integration of circuit devices. As a result, a large number of main circuits can be mounted on a single integrated circuit device, such as a circuit element.

It is a matter of course that the integrated circuit device be subjected to various tests after its manufacture. One of these tests is an AC test, which is well known in the art.

The AC test is generally carried out on the integrated circuit device as a whole, and will be referred to hereunder as the whole AC test. In addition, the AC test is often carried out on each of the main circuits and will, thus, be an individual AC test. The individual AC test is strongly required in particular case where the memory is mounted as one of the main circuits on the integrated circuit device. This is because it is difficult in this particular case to carry out the whole AC test with a high efficiency.

A conventional integrated circuit device comprises paths from the test pads, which are junctions between the inside and outside of the integrated circuit device to the main circuits. In order to carry out the individual AC test, a test unit is connected to the test pads. The test unit is for producing a test signal and for analyzing the output signals produced by each of the main circuits. More particularly, the test signal is supplied as an input signal to a selected one of the main circuits through one of the test pads. Responsive to the test signal, the selected main circuit produces an output signal. The output signal is supplied back to the test unit through another one of the test pads.

However, the integrated circuit device has various disadvantages.

(a) the test unit order to produce the test signal and to analyze the output signal is complicated and expensive.

(b) inasmuch as the test and output signals are transmitted through the paths from the main circuits under test to test pads, additional capacitance is added to the main circuits under test.

(c) it is unavoidable to make the integrated circuit device large in size, since the paths from the main circuits under test to the test pads take up a large area in the integrated circuit device.

SUMMARY OF THE INVENTION

It is therefore an object of this invention to provide an integrated circuit device which has a circuit for use in a predetermined test of a main circuit.

It is another object of this invention to provide an integrated circuit device of the type described, in which the predetermined test can be carried out without the supply of a test signal from a test unit.

Other objects of this invention will become clear as the description proceeds.

According to this invention, there is provided an integrated circuit device comprising a main circuit for producing an output signal in response to an input signal, and a supplementary circuit connected to the main circuit for carrying out a test operation of the main circuit. The supplementary circuit comprises a test signal producing circuit for producing a test signal, and supplying means connected to the main and the signal producing circuits for supplying the test signal as the input signal to the main circuit. The main circuit produces a data signal as the output signal in response to the test signal. The supplementary circuit further comprises a data signal processing circuit connected to the main circuit for processing the data signal into a result signal representative of a result of the test operation.

DESCRIPTION OF THE PREFERRED EMBODIMENTS

Figure 1:
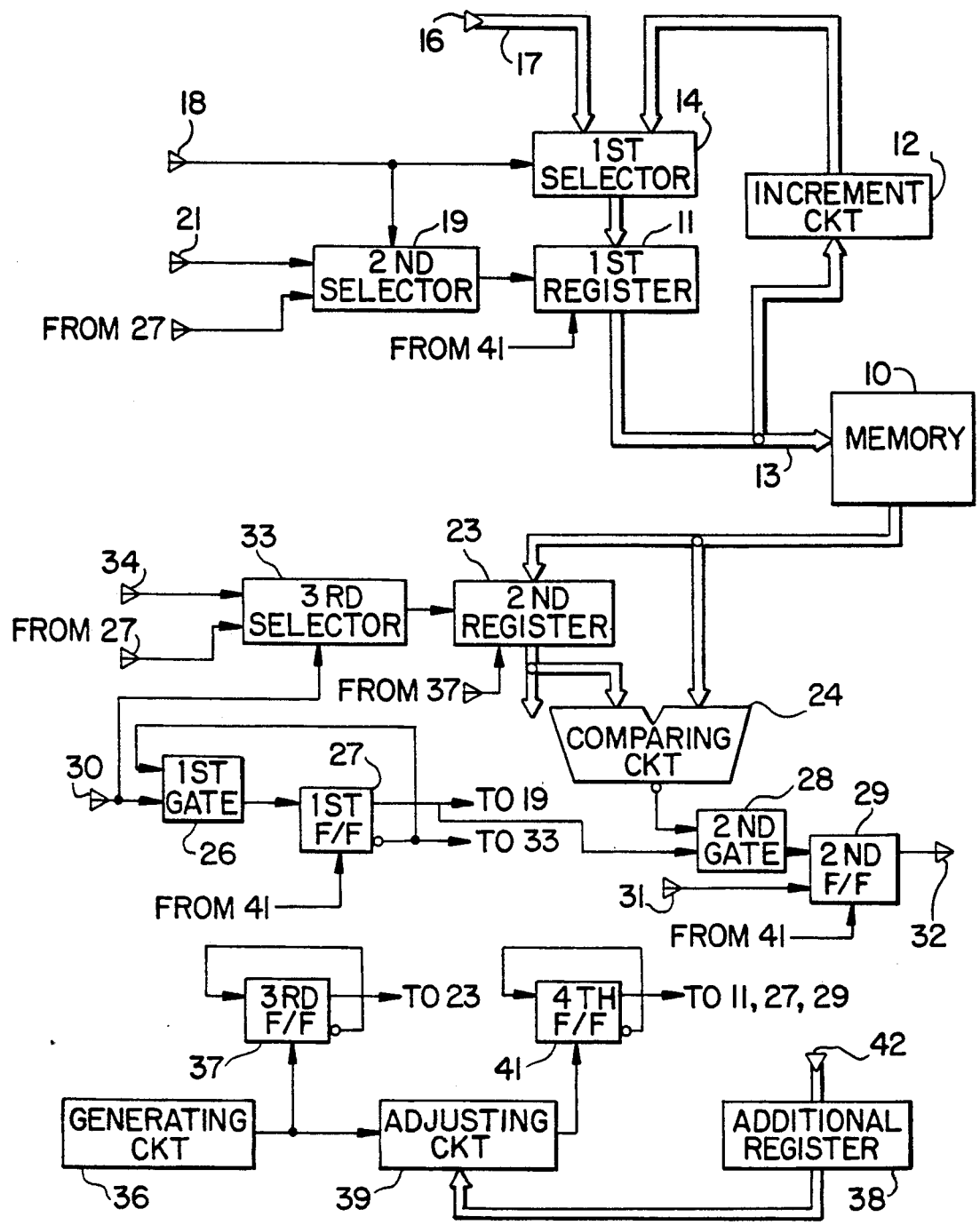
FIG. 1 is a block diagram of an integrated circuit device according to a first embodiment of this invention.

Referring to FIG. 1, an integrated circuit device according to a first embodiment of this invention comprises a main circuit 10 and a circuit part which will be referred to hereunder as a supplementary circuit. In the example being illustrated, the main circuit 10 comprises a plurality of memory elements (not shown) and therefore will be called hereunder a memory. The memory 10 produces an output signal in response to an input signal in a manner known in the art. The supplementary circuit is connected to the memory 10, for carrying out a test operation of the memory 10 in the manner which will later be described in detail.

The supplementary circuit comprises a first register circuit 11 and an increment circuit 12 connected to the first register circuit 11. The first register circuit 11 is for memorizing an input address number indicative of an address of one of the memory elements. With reference to a first register set signal and a particular signal which will later become clear, the first register circuit 11 produces a test signal representative of the input address number. The test signal is supplied as the input signal to the memory 10 through a first supplying line 13. Responsive to the test signal used as the input signal, the memory 10 produces a data signal as the output signal. The data signal represents an output address number indicative of the above-mentioned one of the memory elements.

The test signal is supplied also to the increment circuit 12. Responsive to the test signal, the increment circuit 12 carries out an addition by adding one to the address number to produce an increment output signal representative of a result of the addition. The increment output signal is supplied to the first register circuit 11 under control by a first selecting circuit 14 in the manner which will later be described. Responsive to the increment output signal, the first register circuit 11 renews the input address number in manner known in the art. A combination of the first register and the increment circuits 11 and 12 is referred to as a test signal producing circuit.

The supplementary circuit further comprises a normal signal input terminal 16 and a second supplying line 17 which will presently be described. The normal signal input terminal 16 is supplied with a normal signal from a peripheral or test unit (not shown) for carrying out a normal operation in a manner known in the art. The second supplying line 17 is connected to the normal signal input terminal 16 and to the memory 10 through the first selecting circuit 14, the first register circuit 11, and the first supplying line 13 and is for supplying the normal signal to the memory 10. It is to be noted that the first selecting circuit 14 enables use of the first register circit 11 in a normal operation.

The first selecting circuit 14 is connected to the first supplying line 13 through the first register circuit 11 and to the second supplying line 17 and is for inhibiting operation of one of the first and second supplying lines 13 and 17, respectively in accordance with a mode signal which is supplied through a selector control terminal or connecting point 18 from another circuit (not shown) and which will later become clear. The first selecting circuit 14 will consequently be referred to as an inhibiting circuit.

The supplementary circuit further comprises a second selecting circuit 19 connected to the first register circuit 11, the selector control terminal 18, and a first normal operation terminal or connecting point 21. The second selecting circuit 19 is supplied with a first normal set signal through the first normal operation terminal 21 from the other circuit and with a first test set signal which will later become clear. In accordance with the mode signal, the second selecting circuit 19 selects, as the first register set signal, one of the first normal set and the first test set signals to send the first register set signal to the first register circuit 11.

The supplementary circuit further comprises a second register circuit 23, a comparing circuit 24, a first gate circuit 26, a second gate circuit 28, a first flip-flop circuit 27, and a second flip-flop circuit 29 which will presently be described. The second register circuit 23 is connected to the memory 10 and is for processing the data signal into a processed signal in accordance with a second register set signal and a specific signal both of which will later become clear. The processed signal is representative of a modified number modified from the output address number. The second register circuit 23 will be referred to as a local processing circuit.

The comparing circuit 24 is connected to the memory 10 and the second register circuit 23. The comparing circuit 24 is for carrying out comparison between the data and the processed signals to produce a local signal representative of a result of the comparison.

The first gate circuit 26 is an AND gate and is connected to a mode signal terminal or connecting point 30 which is supplied with the mode signal that is supplied to the first and the second selecting circuits 14 and 19. Responsive to the mode signal and a gate input signal which will later become clear, the first gate circuit 26 produces a first gate output signal.

The first flip-flop circuit 27 is a D flip-flop and is connected to the first gate circuit 26. Responsive to the first gate output signal, the first flip-flop circuit 27 produces the above-mentioned first test set signal and a second test set signal in accordance with the particular signal. The first test set signal has a first polarity and is supplied to the second selecting circuit 19 and the second gate circuit 28. The second test set signal has a second polarity which is inverted relative to the first polarity. The second test set signal is supplied as the gate input signal to the first gate circuit 26.

The second gate circuit 28 is an AND gate and is connected to the comparing and the first flip-flop circuits 24 and 27. Responsive to the local and the first test set signals, the second gate circuit 28 produces a second gate output signal.

The second flip-flop circuit 29 is an SR flip-flop and is connected to the second gate circuit 28. Responsive to the second gate output signal and a reset signal which is supplied through a reset terminal or connecting point 31 from the other circuit, the second flip-flop circuit 29 produces a result signal in accordance with the particular signal. The result signal is representative of a result of the test operation and is sent to the test unit through a circuit output terminal 32. A combination of the second gate and the second flip-flop circuits 28 and 29 will be referred to as an additional processing circuit. A combination of the comparing circuit 24 and the additional processing circuit will be referred to as a local producing circuit. A combination of the second register circuit 23 and the local producing circuit is referred to as a data signal processing circuit.

The supplementary circuit further comprises a third selecting circuit 33 and a second normal operation terminal or connecting point 34 which is supplied with a second normal set signal from the other circuit. The third selecting circuit 33 is connected to the mode signal input and the second normal operation terminals 30 and 34 and to the first flip-flop circuit 27 and is supplied with the mode, the second normal set, and the second test set signals. In accordance with the mode signal, the third selecting circuit 33 selects, as the second register set signal, one of the second normal set and the second test set signals to send the second register set signal to the second register circuit 23. It is to be noted that the third selecting circuit 33 enables normal operation of the second register circuit 23.

The supplementary circuit further comprises a generating circuit 36, a third flip-flop circuit 37, an additional register circuit 38, an adjusting circuit 39, and a fourth flip-flop circuit 41 which will presently be described. The generating circuit 36 is for generating an original clock signal having a predetermined frequency. The third flip-flop circuit 37 is connected to the generating circuit 36 and is for producing the specific signal in response to the original clock signal. A combination of the generating and the third flip-flop circuits 36 and 37 will be referred to as a specific signal producing circuit.

The additional register circuit 38 is for producing an adjusting signal in response to an additional input signal which is supplied through an additional terminal 42 from the peripheral unit. The adjusting circuit 39 is connected to the generating and the additional register circuits 36 and 39 and is for adjusting the original clock signal into an adjusted clock signal in accordance with the adjusting signal. The fourth flip-flop circuit 41 is connected to the adjusting circuit 39 and is for producing the particular signal in response to the adjusted clock signal. A combination of the generating and the fourth flip-flop circuits 36 and 41 will be referred to as a particular signal producing circuit.

Figure 2:
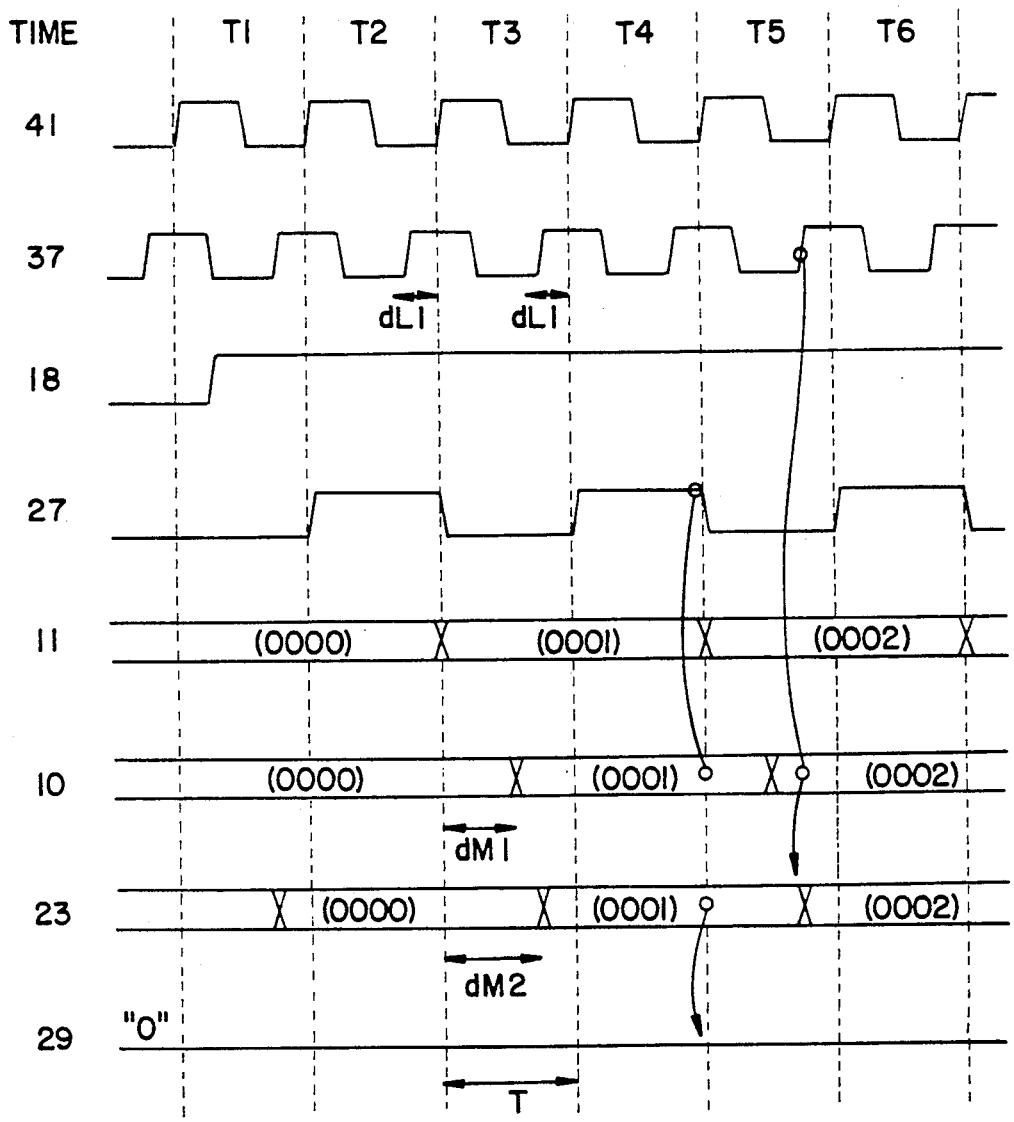
FIG. 2 is a time chart describing an example of operation of the integrated circuit device illustrated in FIG. 1.

Referring to FIG. 2 together with FIG. 1, the description will proceed to an example of operation of the integrated circuit device. Time intervals are illustrated along a first or top line labelled TIME as first, second, third, fourth, fifth, and sixth time intervals T1, T2, T3, T4, T5, and T6. Produced by the fourth flip-flop circuit 41, the particular signal is depicted along a second line labelled 41. Related to the third flip-flop circuit 37, the specific signal is shown along a third line labelled 37. In similar manner, the mode signal is illustrated along a fourth line labelled 18. The first test set signal is depicted along a fifth line labelled 27. The input address number is shown along a sixth line labelled 11. The output address number is illustrated along a seventh line labelled 10. The modified number is depicted along an eighth line labelled 23. The result signal is shown along a ninth or bottom line labelled 29.

In the manner of the second line, the particular signal has a predetermined period T and a particular phase which can be adjusted by the adjusting circuit 39 in accordance with the additional input signal supplied to the additional terminal 42. In the manner, exemplified by the third line, the specific signal has the predetermined period T and a specific phase which is different from the particular phase with a phase difference dL1 left therebetween. The phase difference dL1 can be adjusted by the adjusting circuit 39 in response to the additional input signal.

The mode signal varies from a logic "0" level to a logic "1" level within the first time interval and is kept at the logic "1" level during the second through the sixth time intervals T2 through T6. The first test set signal has a logic "0" level in each of the second, the fourth, and the sixth time intervals T2, T4, and T6 and has a logic "1" level in each of the first, the third, and the fifth time intervals T1, T3, and T5. Before the mode signal varies from the logic "0" level to the logic "1" level, determination is carried out so that the input address number is given "0000" and that the result signal has a logic "0" level. The input and the output address numbers are kept at "0000" during the first and the second time intervals T1 and T2. The modified number is given "0000" in the first time interval T1 and is kept at "0000" during at least the second time interval T2.

In the second time interval T2, the first test set signal is turned to the logic "1" level. The modified number is compared with the output address number by the comparing circuit 24. When the modified number is not equal to the output address number, the comparing circuit 24 produces the local signal of a logic "1" level. Otherwise, the comparing circuit 24 produces the local signal of a logic "0" level. At an end of the second time interval T2, the input address number becomes "0001".

In the third time interval T3, the output address number becomes "0001" at a first time point determined by lapse of a first delay time dM1 from the end of the second time interval T2. The modified number becomes "0001" at a second time point determined by lapse of a second delay time dM2 from the end of the second time interval T2. The second delay time dM2 is given as follows:

$$dM2 = T - dL1.$$

Although the comparing circuit 24 produces the local signal of a logic "1" level during the first through the second time points, the second gate circuit 28 does not produce the second gate output signal. This is because the second gate circuit 28 is supplied with the first test set signal of a logic "0" level.

During the fourth time interval T4, the modified number is kept at "0001" and is compared with the output address number by the comparing circuit 24. When the modified number is different from the output address number, the second gate circuit 28 produces the second gate output signal. This is because both the local and the first test set signals are represented by the logic "1" level.

The operation of the third and the fourth time intervals T3 and T4 is repeated so long as the mode signal has the logic "1" level. In the example illustrated, the second gate circuit 28 does not produce the second gate output signal during the first through sixth time intervals T1 to T6. This is because the first and the second delay times dM1 and dM2 are determined as follows:

$$dM1 < dM2.$$

Inasmuch as the second gate output signal is not supplied to the second flip-flop circuit 29, the result signal has a logic "0" level during the first through the sixth time intervals T1 to T6.

Figure 3:
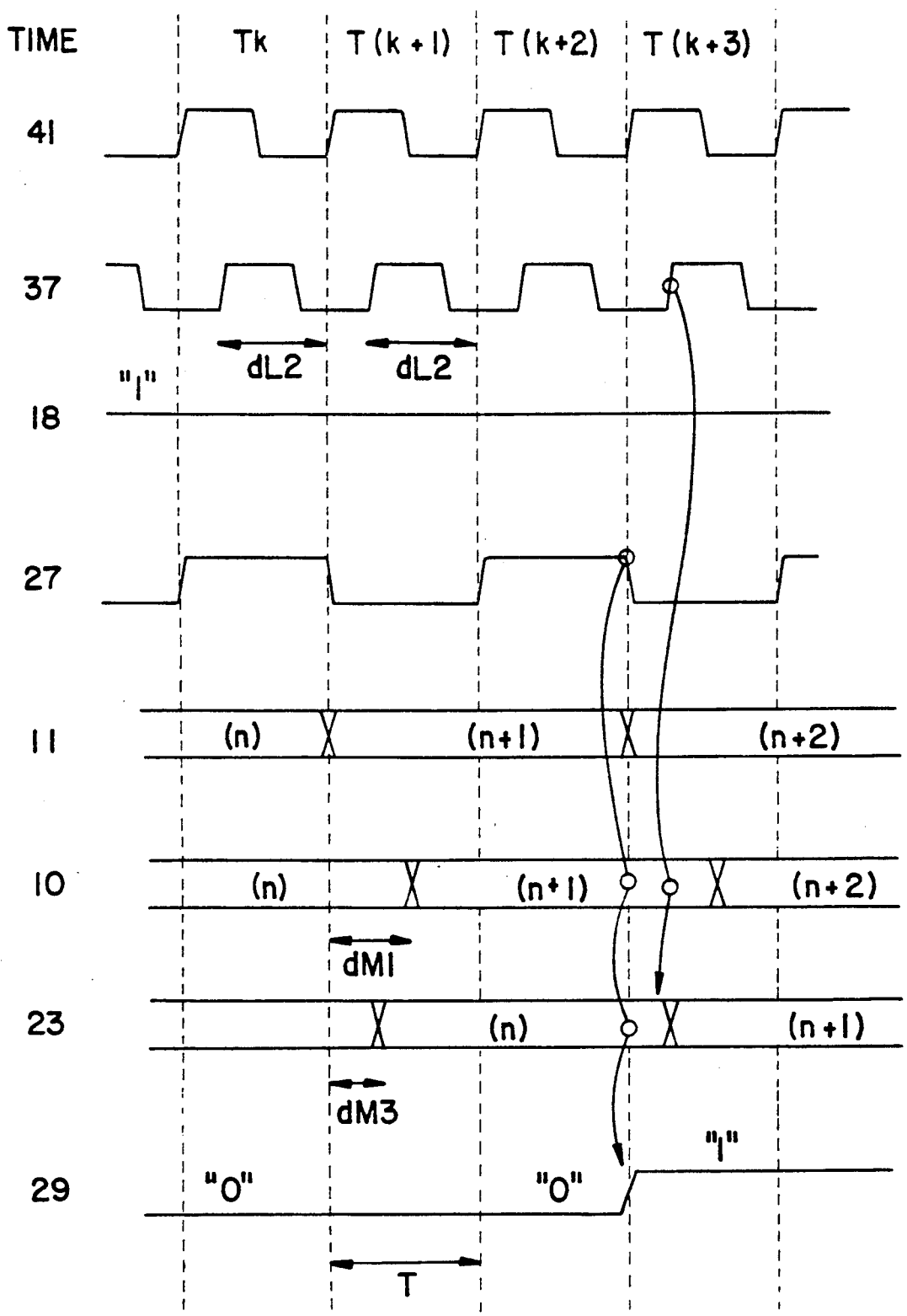
FIG. 3 is a time chart describing another example of the operation of the integrated circuit device illustrated in FIG. 1.

Turning to FIG. 3 with reference to FIGS. 1 and 2 continued, the description will proceed to another example of operation of the integrated circuit device. After the sixth time interval T6, the time intervals are illustrated along the first line as a k-th, (k+1)-th, (k+2)-th, and (k+3)-th time intervals Tk, T(k+1), T(k+2), and T(k+3). In the manner which becomes clear from the second and the third lines, the particular and the specific signals have an adjusted phase difference dL2 therebetween which is greater than the first-mentioned phase difference dL1.

In the manner exemplified by the sixth and the seventh lines, the input and the output address numbers are given "n" in the k-th time interval Tk. At an end of the k-th time interval Tk, the input address number becomes "(n+1)" and is kept at "(n+1)" during the (k+1)-th and (k+2)-th time intervals T(k+1) and T(k+2).

In the (k+1)-th time interval T(k+1), the output address number becomes "(n+1)" at the first time point described in conjunction with FIG. 2. The output address number is kept at "(n+1)" during at least the (k+2)-th time interval T(k+2). The modified number is given "n" at a third time point determined by lapse of a third delay time dM3 from the end of the k-th time interval Tk. The modified number is kept at "n" during at least the (k+2)-th time interval T(k+2). The third delay time dM3 is given as follows:

$$dM3 = T - dL2.$$

Inasmuch as the adjusted phase difference dL2 is greater than the first-mentioned phase difference dL1, the first and the third delay times dM1 and dM3 are determined as follows:

$$dM1 > dM3.$$

Although the comparing circuit 24 produces the local signal of the logic "1" level after the first time point, the second flip-flop circuit 29 produces the result signal of the logic "0" level before and end of the (k+2)-th time interval T(k+2) as depicted along the ninth or bottom line. This is because the particular signal is not turned to the logic "1" level with the first test set signal having the logic "1" level. It is to be noted herein that the first test set signal is turned to the logic "1" level in accordance with the particular signal.

At the end of the (k+2)-th time interval T(k+2), the particular signal is turned to the logic "1" level with the first test set signal having the logic "1" level. As a result, the second flip-flop circuit 29 produces the result signal of a logic "1" level. The result signal is kept at the logic "1" level until the reset signal is supplied to the second flip-flop circuit 29. This means that the result signal is turned from the logic "0" level to the logic "1" level with lapse of time in a case where the particular and the specific signals have the adjusted phase difference dL2 therebetseen.

For carrying out an AC test which is well known in the art, the first delay time dM1 is measured by the peripheral unit as follows. First, the operation of the integrated circuit device being illustrated is carried out with the first-mentioned phase difference dL1 given by the adjusting circuit 39 between the particular and specific signals, in the manner described in connection with FIG. 2. In this event, the second flip-flop circuit 29 does not produce the result signal of the logic "1" level. Next, the particular phase is adjusted by the adjusting circuit 39 to increase the first-mentioned phase difference dL1 towards the adjusted phase difference dL2. When the first-mentioned phase difference dL1 becomes equal to a particular phase difference, the second flip-flop circuit 29 supplies the peripheral unit with the result signal of the logic "1" level. With reference to the particular phase difference and the predetermined period T, the peripheral unit produces a delay time signal representative of the first delay time dM1.

Figure 4:
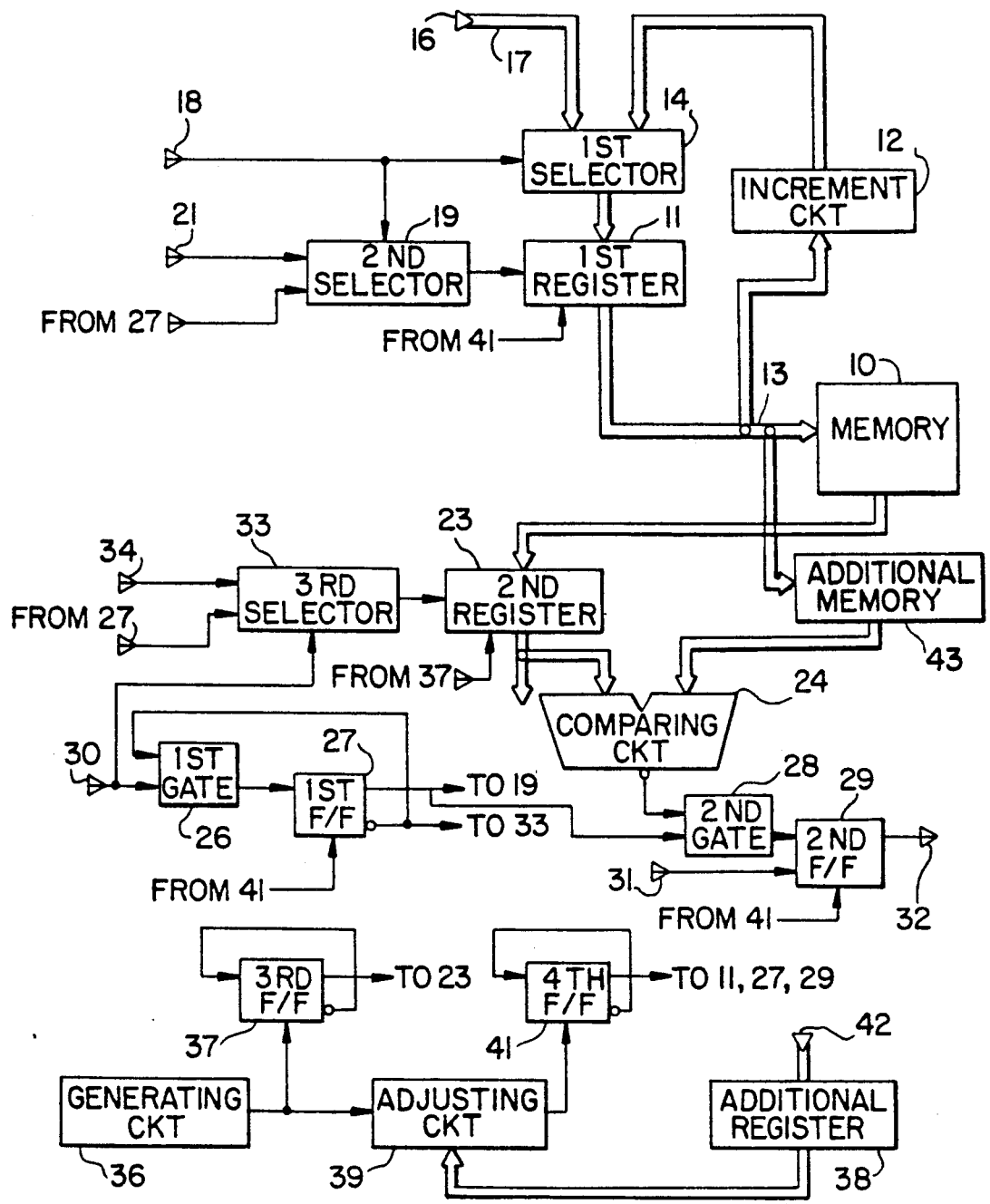
FIG. 4 is a block diagram of a part of an integrated circuit device according to a second embodiment of this invention.

Turning to FIG. 4, the description will proceed to an integrated circuit device according to a second embodiment of this invention. The integrated circuit device comprises similar parts designated by like reference numerals.

The integrated circuit device further comprises an additional memory 43 connected to the first register circuit 11 through the first supplying line 13. In contrast to the additional memory 43, the main circuit 10 will be referred to as a main memory 10. The additional memory 43 is connected to the comparing circuit 24 in place of the main memory 10. The additional memory 43 is for producing the data signal in the manner which will become clear in the following.

The main memory 10 has a plurality of even addresses and a plurality of odd addresses. The additional memory 43 comprises a first and a second memory area for memorizing a first and a second number pattern, respectively. It is assumed herein that the first number pattern is given by "555555" and that the second number pattern is given by "AAAAAA". The first number pattern is memorized in the main memory 10 and in the first memory area of the additional memory 43. The second number pattern is memorized in the main memory 10 and in the second memory area.

When the test signal is supplied through the first supplying line 13 to indicate one of the even addresses as the input address number, the main memory 10 supplies the first number pattern as the data signal to the second register circuit 23. When the test signal indicates one of the odd addresses, the main memory 10 supplies the second number pattern as the data signal to the second register circuit 23. In the manner described before, the second register circuit 23 processes the data signal into the processed signal.

Each input address number is represented by four bits, namely, by a first or most significant, a second, a third, and a fourth or least significant bit. When the test signal is supplied through the first supplying line 13 to indicate one of the even addresses as the input address number, the least significant bit represents "0". When the test signal indicates one of the odd addresses as the input address number, the most significant bit represents "1". The first memory area of the additional memory 43 is indicated when the test signal indicates "0" as the least significant bit. The second memory area is indicated by the test signal when the least significant bit represents "1". Responsive to the least significant bit of "0", the additional memory 43 supplies the first number pattern as the data signal to the comparing circuit 24. Responsive to the least significant bit of p37 1", the additional memory 43 supplies the second number pattern as the data signal to the comparing circuit 24.

The comparing circuit 24 carries out the comparison between the processed and the data signals to produce the local signal described while the operation is illustrated with reference to FIG. 2. It is therefore possible in the integrated circuit device being illustrated to carry out the AC test without supply of the test signal from the peripheral unit.

While the present invention has thus far been described in connection with only a few embodiment thereof, it will readily be possible for those skilled in the art to put this invention into practice in various other manners. For example, the integrated circuit device may be designed so that the specific phase is adjusted by the adjusting circuit 39. It is a matter of course that the particular and the specific phases may both be adjusted.

What is claimed is:

1. An integrated circuit device comprising:
   a main circuit for producing an output signal in response to an input signal; and
   a supplementary circuit connected to said main circuit for carrying out a test operation of said main circuit,
   said supplementary circuit comprising:
   a test signal producing circuit for producing a test signal;
   supplying means connected to said main and said test signal producing circuits for supplying said test signal as said input signal to said main circuit, said main circuit producing a data signal as said output signal in response to said test signal;
   a data signal processing circuit connected to said main circuit for processing said data signal into a result signal representative of the result of said test operation;
   a particular signal producing circuit connected to said signal producing circuit for producing a particular signal having a predetermined cycle and a particular phase; and
   a specific signal producing circuit connected to said processing circuit for producing a specific signal having said predetermined cycle and a specific phase which is different from said particular phase, said test signal producing circuit producing said test signal with reference to said particular signal, said data signal processing circuit producing said result signal with reference to said specific signal.

2. An integrated circuit device as claimed in claim 1, wherein said data signal processing circuit comprises:
   a local processing circuit connected to said main circuit and said specific signal producing circuit for processing said data signal into a processed signal in accordance with said specific signal; and a local producing circuit connected to said main circuit and said local processing circuit for producing said result signal in accordance with said data and said processed signals.

3. An integrated circuit device as claimed in claim 2, wherein said local producing circuit comprises:
   a comparing circuit connected to said main circuit and said local processing circuit for carrying out comparison between said data and said processed signals to produce a local signal representative of a result of said comparison; and
   an additional processing circuit connected to said particular signal producing and said comparing circuits for processing said local signal into said result signal in accordance with said particular signal.

4. An integrated circuit device as claimed in claim 1, wherein said supplementary circuit further comprises adjusting means connected to said particular and said specific signal producing circuits for adjusting at least one of said particular and said specific phases.

5. An integrated circuit device as claimed in claim 1, wherein said supplementary circuit further comprises:
   an input terminal supplied with a normal signal;
   additional supplying means connected to the first-mentioned supplying means and said input terminal for supplying said normal signal to the first-mentioned supplying means, the first-mentioned supplying means supplying said normal signal as said input signal to said main circuit; and
   an inhibiting circuit connected to said test signal producing circuit and said additional supplying means for inhibiting operation of one of said test signal producing circuit and said additional supplying means.

6. An integrated circuit device as claimed in claim 1, wherein said main circuit comprises a memory connected to said supplying means for memorizing a number pattern to produce said data signal in accordance with said test signal and said number pattern,
   said data signal processing circuit comprising:
   a local processing circuit connected to said main circuit and said specific signal producing circuit for processing said data signal into a processed signal in accordance with said specific signal; and
   a local producing circuit connected to said local processing circuit and said memory for producing said result signal in accordance with said processed and said data signals.

7. An integrated circuit device as claimed in claim 6, wherein said local producing circuit comprises:
   a comparing circuit connected to said local processing circuit and said memory for carrying out comparisons between said processed and said data signals to produce a local signal representative of a result of said comparison; and
   an additional processing circuit connected to said particular signal producing and said comparing circuits for processing said local signal into said result signal with reference to said particular signal.

* * * * *